US007396717B2

(12) United States Patent
Wang et al.

(10) Patent No.: US 7,396,717 B2
(45) Date of Patent: Jul. 8, 2008

(54) METHOD OF FORMING A MOS TRANSISTOR

(75) Inventors: Hsiang-Ying Wang, Chia-Yi Hsien (TW); Chin-Cheng Chien, Tainan Hsien (TW); Tsai-Fu Hsiao, Hsin-Chu (TW); Ming-Yen Chien, Kao-Hsiung Hsien (TW); Chao-Chun Chen, Kao-Hsiung (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/278,434

(22) Filed: Apr. 3, 2006

(65) Prior Publication Data

US 2007/0238234 A1  Oct. 11, 2007

(51) Int. Cl.
*H01L 21/8238* (2006.01)
(52) U.S. Cl. ............... 438/232; 257/E29; 257/344; 438/519; 438/522; 438/527; 438/530
(58) Field of Classification Search ......... 438/232, 438/519, 522, 527, 530
See application file for complete search history.

(56) References Cited

U.S. PATENT DOCUMENTS

| 5,908,313 | A | * | 6/1999 | Chau et al. .............. 438/299 |
| 5,959,333 | A | | 9/1999 | Gardner et al. |
| 6,232,166 | B1 | | 5/2001 | Ju |
| 6,303,450 | B1 | | 10/2001 | Park et al. |
| 6,391,731 | B1 | * | 5/2002 | Chong et al. .............. 438/303 |
| 6,682,980 | B2 | | 1/2004 | Chidambaram et al. |
| 2003/0207542 | A1 | | 11/2003 | Chidambaram |
| 2004/0132260 | A1 | * | 7/2004 | Lenoble .................. 438/306 |
| 2006/0252239 | A1 | * | 11/2006 | Hierlemann ............. 438/527 |
| 2007/0037326 | A1 | * | 2/2007 | Chen et al. .............. 438/151 |
| 2007/0148888 | A1 | * | 6/2007 | Krull et al. .............. 438/306 |

OTHER PUBLICATIONS

Ellis-Monaghan, J., Kam-Leung Lee, Meikei Ieong, Yang, I., "Carbon Implanted Halo for Super Halo characteristics NFETs in Bulk and SOI", Sep. 11-13, 2001, Solid-State Device Research Conference, 2001. Proceeding of the 31st European.

* cited by examiner

*Primary Examiner*—Michelle Estrada
*Assistant Examiner*—Ankush K Singal
(74) *Attorney, Agent, or Firm*—Winston Hsu (57) ABSTRACT

A method of forming a MOS transistor, in which a co-implantation is performed to implant an implant into a source region and a drain region or a halo implanted region to effectively prevent dopants from over diffusion in the source region and the drain region or the halo implanted region, for obtaining a good junction profile and improving short channel effect. The implant comprises carbon, a hydrocarbon, or a derivative of the hydrocarbon, such as one selected from a group consisting of C, $Chd\, xH_y^+$, and $(C_xH_y)_n^+$, wherein x is a number of 1 to 10, y is a number of 4 to 20, and n is a number of 1 to 1000.

18 Claims, 13 Drawing Sheets

METHOD OF FORMING A MOS TRANSISTOR

BACKGROUND OF THE INVENTION

1. Field of the Invention

The present invention relates a method of forming a MOS transistor, and particularly a method of forming a MOS transistor having an improved short channel effect, comprising a step of co-implantation using an implant comprising carbon, hydrocarbon, or a derivative thereof.

2. Description of the Prior Art

Field effect transistors (FETs) are important electronic devices in the fabrication of integrated circuits, and as the size of the semiconductor device becomes smaller and smaller, the fabrication of the transistors also improves and is constantly enhanced for fabricating transistors with smaller sizes and higher quality.

In the conventional method of fabricating transistors, a gate structure is first formed on a substrate, and a lightly doped drain (LDD) is formed on the two corresponding sides of the gate structure. Next, a spacer is formed on the sidewall of the gate structure and an ion implantation process is performed to form a source/drain region within the substrate by utilizing the gate structure and spacer as a mask. Finally, an anneal process is performed.

Figure 1:
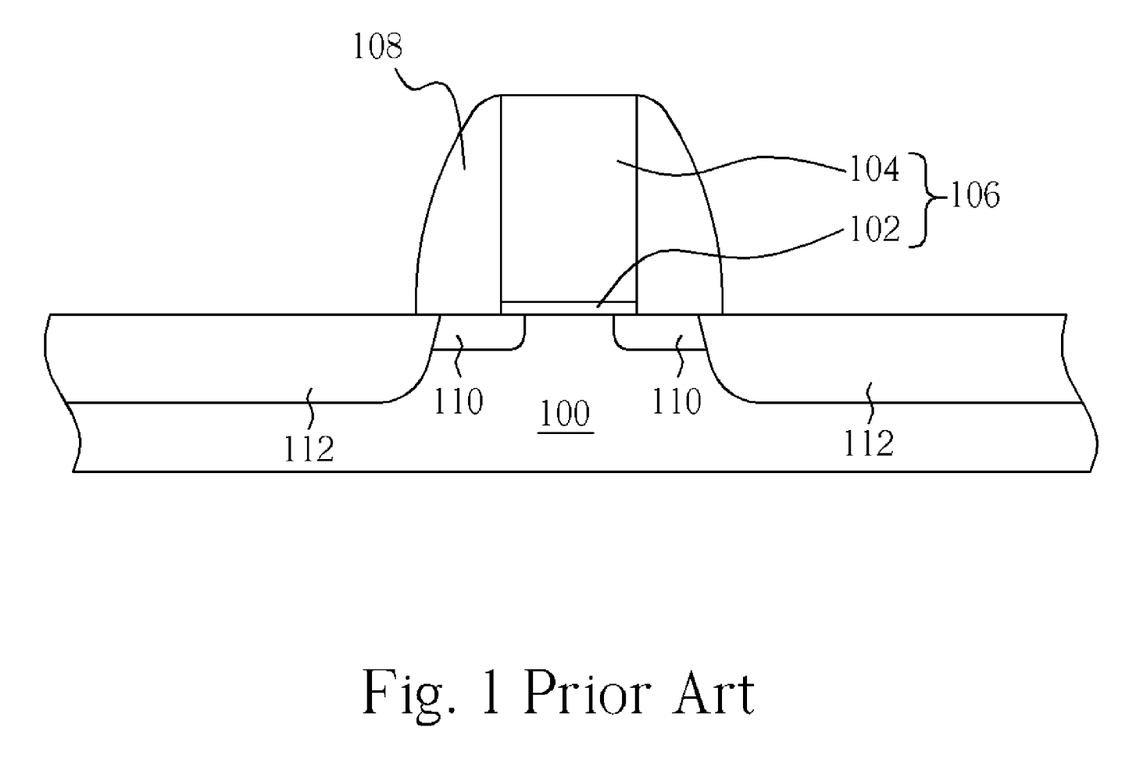
FIG. 1 is a schematic structural diagram showing a conventional field effect transistor.

Refer to FIG. 1, a schematic diagram showing a conventional field effect transistor. As shown in FIG. 1, a gate structure 106 having a gate dielectric layer 102 and a gate electrode 104 is first formed on a substrate 100. Next, an ion implantation process is performed to form a lightly doped drain 110 in the substrate 100. Next, a spacer 108 is formed on the sidewall of the gate structure 106 and another ion implantation is performed to form a source/drain region 112 in the substrate 100. Subsequently, a rapid thermal process (RTP) is performed to obtain a FET.

With the device scaling down, it's difficult to control the junction depth ($X_j$) and also reduce the access resistance. The short channel effect (SCE) noticeably depends on the junction depth. The junction depth for the source/drain of a transistor must be reduced to avoid the short channel effect of the MOS arisen from the shrinkage of the MOS size to increase the integration of the device. A lot of papers have demonstrated many approaches to improve the pFET SCE. But from 65 nm node and beyond, the conventional As implantation and spike RTP can hardly meet the nFET SCE requirement.

From the above viewpoint, the shallower as-implant depth by heavy ions or less diffusion activation tool is needed. Unfortunately the advanced activation tools (for example, flash or laser anneal) are under development and not mature.

A method of manufacturing a PMOS transistor has been disclosed to implant fluorine in a source/drain extension region or source/drain region to be with the dopants thereat together. The diffusion for the dopants can be improved during a subsequent annealing process, to alleviate the SCE.

However, due to transistors with smaller sizes and higher quality are constantly desired, an FET with an improved SCE and a good junction profile and a method of manufacturing it are still needed.

SUMMARY OF THE INVENTION

One object of the present invention is to provide a method of forming a MOS transistor with an improved short channel effect.

The method of forming a MOS transistor according to the present invention comprises the steps as follows. First, a substrate having a gate thereon, a source region and a drain region therein with a channel region under the gate therebetween is provided. Next, the source region and the drain region are pre-amorphized to form amorphized regions. Subsequently, a first ion implantation is performed to implant a first dopant in the source region and the drain region to form a first doped region. At least a spacer is formed on the sidewalls of the gate. A second ion implantation is performed to implant a second dopant in the source region and the drain region to form a second doped region. The source region and the drain region are annealed to activate the first dopant, regrow the amorphized regions to a substantially crystalline form, and form a junction profile. Among these steps, a co-implantation process is performed after pre-amorphizing the source region and the drain region and before annealing the source region and the drain region, to implant an implant in the source region and the drain region, wherein the implant comprises carbon, a hydrocarbon compound, or a derivative of the hydrocarbon compound.

In another embodiment of the present invention, the method of forming a MOS transistor comprises the steps as follows. First, a substrate having a gate thereon, a source region and a drain region therein with a channel region under the gate therebetween is provided. Next, an implant is implanted into the source region and the drain region for achieving both pre-amorphization and co-implantation of the source region and the drain region to form amorphized regions with the implant, wherein the implant comprises carbon, a hydrocarbon compound, or a derivative of the hydrocarbon compound. Next, a first ion implantation is performed to implant a first dopant in the source region and the drain region to form a first doped region. At least one spacer is formed on the sidewalls of the gate. A second ion implantation is performed to implant a second dopant in the source region and the drain region to form a second doped region. Finally, the source region and the drain region are annealed to activate the first dopant, regrow the amorphized regions to a substantially crystalline form, and form a junction profile.

Furthermore, the MOS transistor according to the present invention comprises a substrate having a gate thereon, a source region and a drain region therein with a channel region under the gate therebetween; at least a spacer disposed on a side wall of the gate; a light doped source region and a light doped drain region disposed in the source region and the drain region; a source and a drain disposed respectively in the source region and the drain region at a side of the light doped source region and a side the light doped drain region; and a halo implanted region formed between the channel region and the source region and between the channel region and the drain region, wherein the halo implanted region comprises an implant comprising carbon, a hydrocarbon compound, or a derivative of the hydrocarbon compound.

In another embodiment according to the present invention, the MOS transistor comprises a substrate having a gate thereon, a source region and a drain region therein with a channel region under the gate therebetween; at least a spacer disposed on a side wall of the gate; a light doped source region and a light doped drain region disposed in the source region and the drain region; a source and a drain disposed respectively in the source region and the drain region at a side of the light doped source region and a side the light doped drain region; and a halo implanted region formed between the channel region and the source region and between the channel region and the drain region, wherein the halo implanted region comprises an implant comprising carbon, a hydrocarbon compound, or a derivative of the hydrocarbon compound.

The method of forming a MOS transistor comprises a step of co-implantation to implant carbon, a hydrocarbon compound, or a derivative of the hydrocarbon compound, such as one selected from a group consisting of C, $C_xH_y^+$, and $(C_xH_y)_n^+$, wherein x is a number of 1 to 10, y is a number of 4 to 20, and n is a number of 1 to 1000, within substantially the same place as that of the lightly doped drain or source, the source region and the drain region, or the halo implanted region. Therefore, after a rapid thermal process is performed, for example, by a conventional implanter and a spike annealing tool, the diffusion of dopants co-existing with the implants from the co-implantation can be reduced. That is, the diffusion of the dopants within the lightly doped drain or source, the source region and the drain region, or the halo implanted region can be effectively controlled, to obtain a good junction profile and an improved short channel effect.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
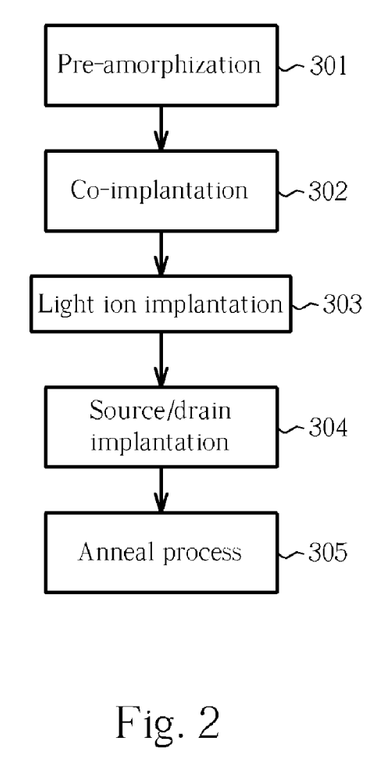
FIG. 2 is a flow chart showing the method of forming a MOS transistor according to the present invention.

Refer to FIGS. 2 to 6 for illustration of an embodiment according to the present invention. FIG. 2 is a flow chart showing the method of forming a MOS transistor according to the present invention. The method of forming a MOS transistor of the embodiment according to the present invention comprises the steps of follows. A substrate having a gate, a source region and a drain region, and a channel region is provided. A pre-amorphization 301 is performed to form an amorphized region in the source region and the drain region, respectively. A co-implantation 302 is performed to implant an implant within the source region and the drain region. A light ion implantation 303 is performed to form a doped region in the source region and the drain region. A spacer is formed on the sidewall of the gate. A source/drain ion implantation 304 is performed to form a doped region. An anneal process 305 is performed to activate the dopants, regrow the amorphized regions to a substantially crystalline form, and form a junction profile.

Figure 3:
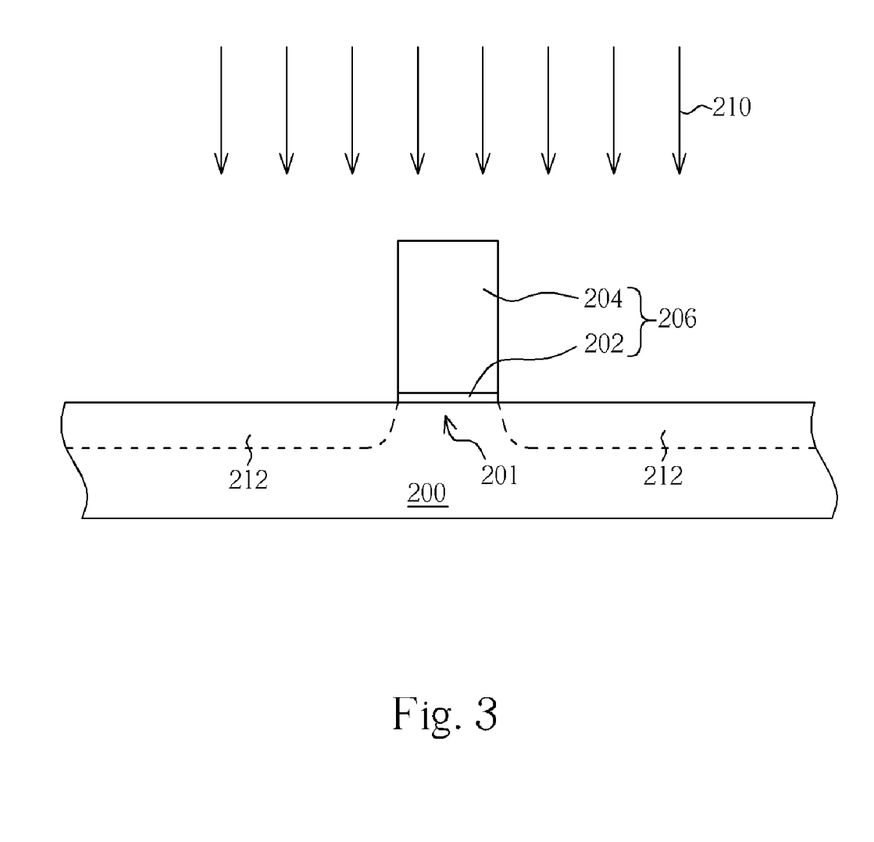
FIGS. 3 to 6 show cross sectional views for the method of forming a MOS transistor according to the present invention.

FIGS. 3 to 6 show cross sectional views for the method of forming a MOS transistor according to the present invention. As shown in FIG. 3, first, a substrate 200 is provided. A gate structure 206 comprises a gate dielectric layer 202 and a gate electrode 204 on the substrate 200. The gate dielectric layer 202 comprises dielectric material such as silicon oxide. The gate electrode 204 comprises a conductive material such as doped polysilicon. A source region and a drain region are defined at two sides of the gate structure 206, and a channel region 201 is under the gate structure 206. Next, the pre-amorphization 301 is performed to form an amorphized region 212 in the source region and the drain region, respectively, to destroy the lattice of the silicon crystalline into an amorphous structure. The pre-amorphizing implantation is performed by an ion implantation 210 through implant an implant into the source region and a drain region. The dopant may be, but not limited to, for example, silicon (Si), antimony (Sb), germanium (Ge), or arsenic (As). For example, a Ge implant having a dose of about $5.033 \times 10^{14}$ atoms/cm$^2$ with an implantation energy of about 40 KeV may be employed, or an As implant having a dose of about $3.033 \times 10^{15}$ atoms/cm$^2$ with an implantation energy of about 40 KeV may be employed. The implantation may be perpendicular to the implanted surface of with an angle as desired. An implantation angle of about 3 to 10 degrees may be used to generate an amorphized region extending to under the gate.

Figure 4:
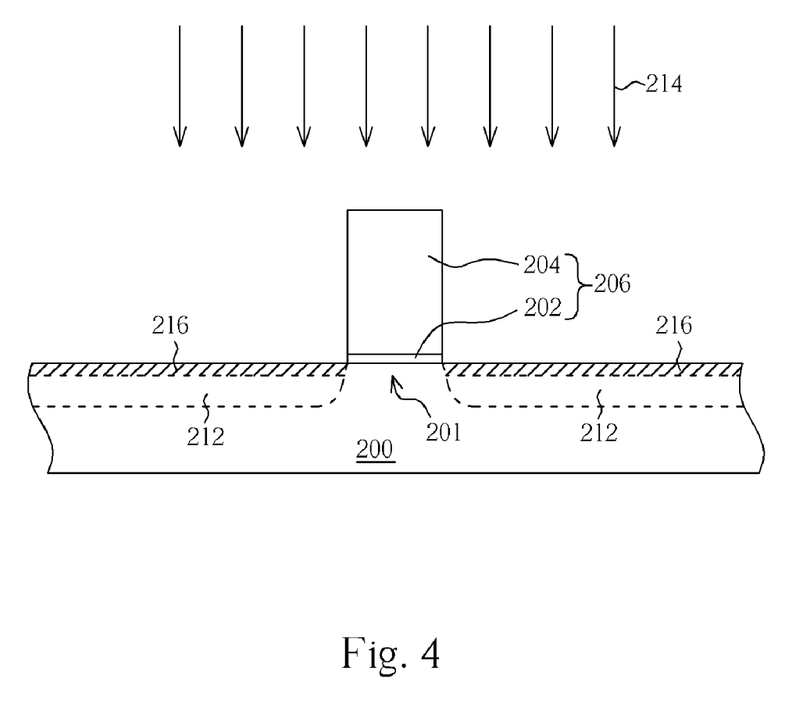

The co-implantation 302 is performed to implant an implant into the source region and the drain region. For example, as shown in FIG. 4, the co-implantation is performed by an ion implantation 214 to form a co-doped region 216 in the light doped drain/source predetermined region. The place for the co-implant in the substrate is not limited to the substantially same place as that of the subsequent dopant implanted by an LDD implantation, and it may be the substantially same place as that of the subsequent dopant implanted by a source/drain implantation. Thus, the short channel effect due to over diffusion of the dopants implanted by the subsequent processes during the anneal process such as the rapid thermal process can be reduced. The implantation energy may depend on the implant position in the substrate, such as 3 KeV to 20 KeV. The dose may be $1 \times 10^{15}$ to $3 \times 10^{15}$ atoms/cm$^3$. The implant may comprise carbon, hydrocarbon compound, or a derivative of the hydrocarbon compound, such as one selected from C, $C_xH_y^+$, and $(C_xH_y)_n^+$, wherein x is a number of 1 to 10, and preferably 1; y is a number of 4 to 20 preferably 4; and n is a number of 1 to 1000, and preferably 800. The implantation may be perpendicular to the implanted surface or with an angle as desired.

Figure 5:
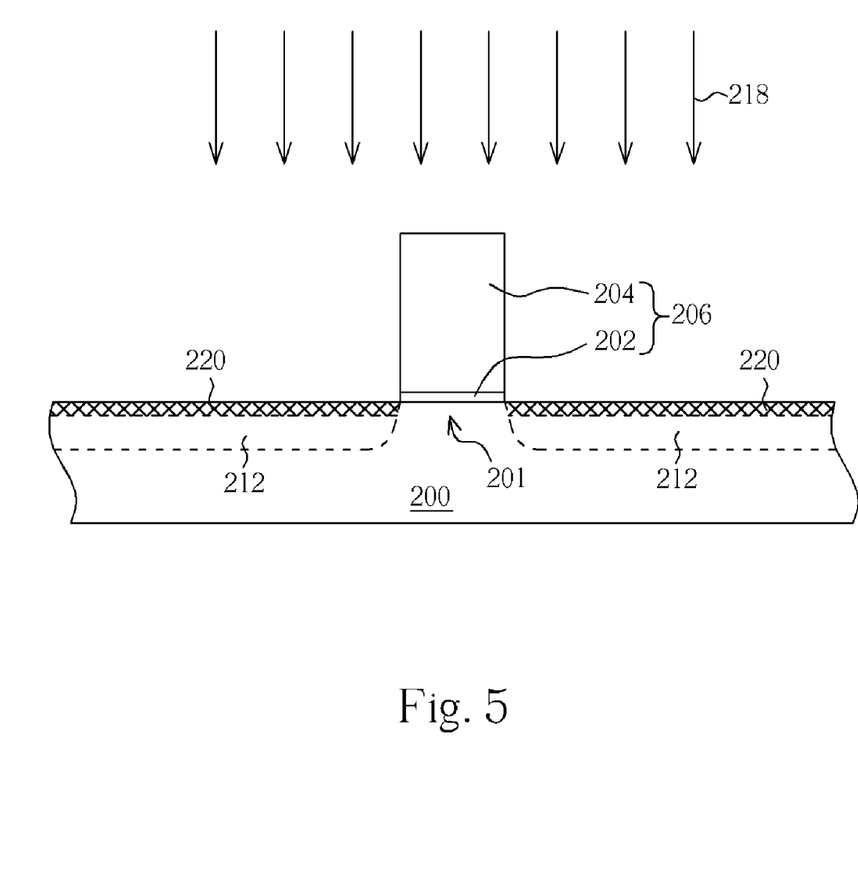

Referring to FIG. 5, the LDD implantation 303 is performed by an ion implantation 218 using the gate 204 as a mask to implant a light dopant into the amorphized region 212 to form a light source/drain region (LDD) 220. In this embodiment, there is an implant from the co-implantation in LDD 220. The dopant used in the light ion implantation may be described as follows. When C is used as an implant, a dopant such as As or P can be used as a light dopant for the source/drain region, to form an n-type LDD (NLDD), and a dopant such as B or $BF_2$ can be used as a light dopant for the source/drain region, to form an p-type LDD (PLDD). When $C_xH_y^+$ or $(C_xH_y)_n^+$ is used as an implant, a dopant such as B, BF2, boron hydride, or a derivative thereof (such as $B_wH_z^+$, or $(B_wH_z)_m^+$) can be used as a light dopant for the source/drain region, to form an PLDD, in which, w is a number of 2 to 30, and preferably 18, z is a number of 2 to 40, and preferably 22, and m is a number of 10 to 1000, and preferably 800. The dose for the light dopant may be, for example, $10^{17}$ to $10^{20}$ atoms/cm$^3$.

After the LDD implantation, a spike rapid thermal process may be further performed to activate dopants. Alternatively, the spike rapid thermal process is not performed at this manufacturing stage, and an anneal process is performed after the source/drain implantation.

Figure 6:
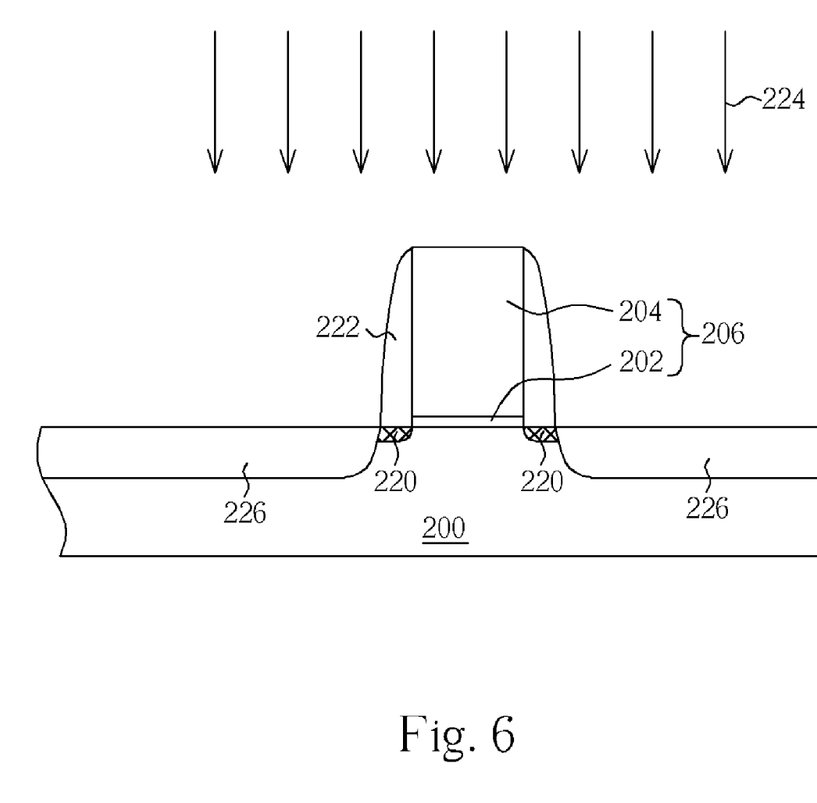

Subsequently, the source/drain implantation 304 is performed. As shown in FIG. 6, a spacer 222 is formed on the sidewall of the gate structure 206. The spacer may be a single layer or a multi-layered structure. For example, the spacer may be composed of a lining layer (such as silicon oxide) and a silicon nitride layer or the spacer may be composed of a silicon oxide offset spacer and a silicon nitride spacer. Thereafter, an ion implantation 224 is performed to implant a heavy dopant within the source region and the drain region to form a heavily doped source/drain 226. The implantation dose of the heavy dopant may be for example $10^{20}$ to $10^{21}$ atoms/cm$^3$. p Finally, the anneal process 305 is performed, such as a rapid thermal process, or a spike anneal process to activate the dopant in the substrate 200 at a high temperature of, for example, 1000 to 1050° C. to form a desired junction profile and regrow the damaged lattice structure of the surface of the substrate 200 caused by ion implantations to a substantially crystalline form.

Figure 12:
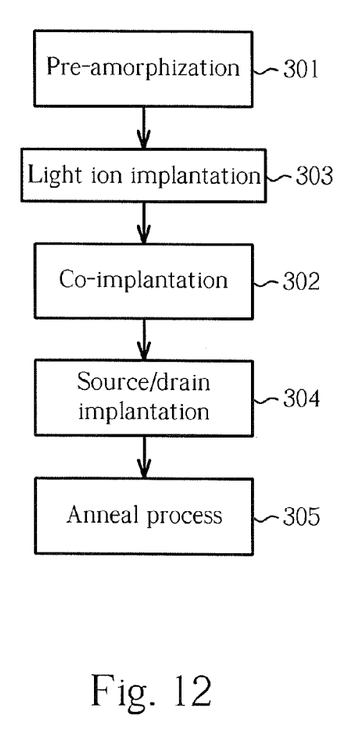
Figure 13:
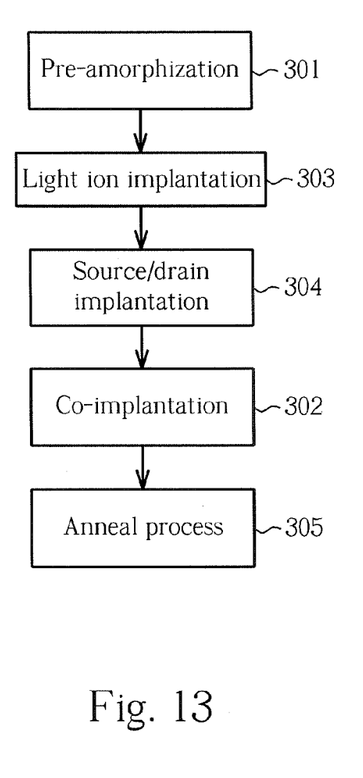

In the flow chart shown in FIG. 2, the co-implantation 302 is performed after the pre-amorphization 301 and before the light ion implantation 303; however, it is noted that the diffusion of dopants in the substrate can be well controlled as long as the co-implantation 302 is performed before the anneal process 305. Accordingly, the co-implantation 302 may be performed after the pre-amorphization 301 and before the light ion implantation 303; or after the light ion implantation 303 and before the source/drain implantation 304, as shown in FIG. 12; or after the source/drain implantation 304 and before the anneal process 305, as shown in FIG. 13. Therefore, the implant is implanted in the substrate 200 at a place substantially the same as that of the light dopant in the lightly doped region or that of the heavy dopant in the source/drain.

Figure 7:
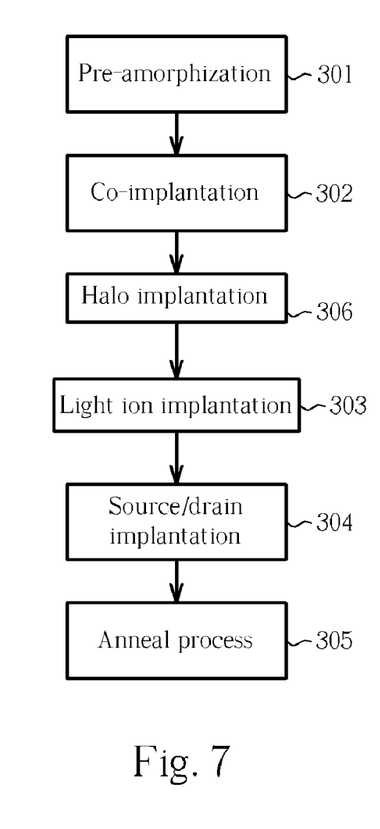
FIG. 7 is a flow chart showing another embodiment of the method of forming a MOS transistor according to the present invention.

Referring to FIG. 7, a flow chart showing another embodiment of the method of forming a MOS transistor according to the present invention has the same steps as the above-described embodiment, except that a halo implantation is further comprised. A halo implant, also called a "pocket implant," has been used to reduce "punch through", i.e., to limit lateral diffusion of the source and the drain dopants in MOS transistors. It is generally performed after the gate is defined and before the source/drain diffusion. Due to the masking effect of the gate, the halo implant peak concentration is near the source/drain region. Away from the source/drain edge, under the gate, the depth of the peak halo concentration falls quickly.

Figure 11:
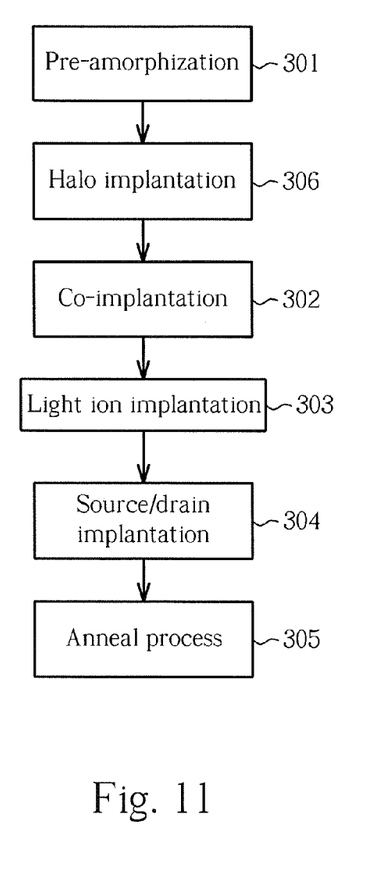
FIGS. 11-13 are flow charts showing some embodiments of the method of forming a MOS transistor according to the present invention.

As shown in FIG. 7, the halo implantation 306 is performed after the co-implantation 302 and before the light ion implantation 303. Nevertheless, it also can be performed after the pre-amorphization 301 and before the co-implantation 302, as shown in FIG. 11. The halo implant is of the conductivity type opposite to that of the source and drain of the MOS device. For example, As is used as a dopant in LDD and B or BF$_2$ may be used as a halo implant to form an nFET. B or BH$_2$ is used as a dopant in LDD and As or P may be used as a halo implant to form a pFET. The concentration of the halo implant in the halo implanted region depends on the device size. The concentration is higher as the size is larger. The concentration may be between $1 \times 10^{17}$ atoms/cm$^3$ and $1 \times 10^{18}$ atoms/cm$^3$, for example. The ion flux may be at an implant angle of 0 to about 30 degree, or greater, from normal (perpendicular) to the substrate, to provide a halo implant which extends slightly under the gate.

Figure 8:
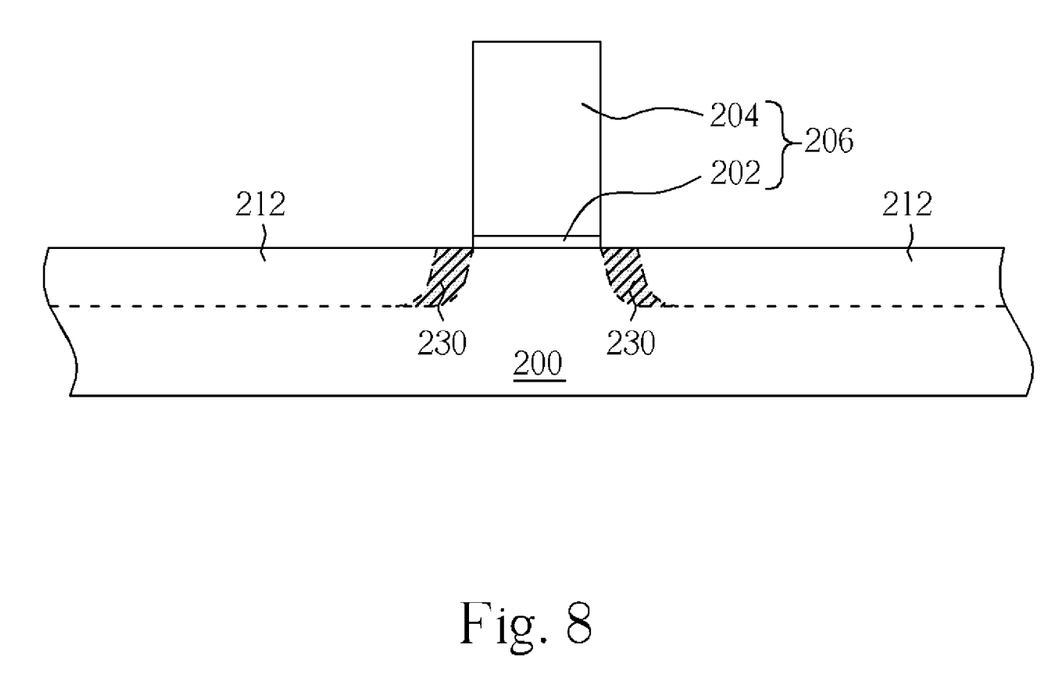
FIG. 8 shows a cross sectional view for the method of forming a MOS transistor according to the present invention, in which the halo implanted region comprises dopants and implants.

In case the halo implantation is included to form the transistor, the implant of the co-implantation may be implanted in the substrate at a place substantially the same as that of the halo implant, in addition to the place substantially the same as that of the light dopant in the lightly doped region or that of the heavy dopant in the source/drain. FIG. 8 shows an embodiment in which the halo implanted region 230 comprises an implant from the co-implantation, in addition to the halo implant. Thus, the diffusion of the halo implant can be well controlled to form a better junction profile.

When carbon, hydrocarbon, or a derivative thereof is implanted as an implant into the doped region and exists with dopants together, the diffusion of the dopants (such as, B or P) can be controlled because the implant occupies the interstitials of the silicon crystalline structure. This situation facilitates the control for the diffusion of dopants, and thus a good junction profile can be obtained.

The method of forming a MOS transistor according to the present invention can be used to form a pPFET or an nFET. For example, when carbon is used as a co-implant in the light doped drain/source, an NLDD can be formed using, for example, As or P as a light dopant in the source region and the drain region, and a PLDD can be formed using, for example, B or BF$_2$ as a light dopant in the source region and the drain region. When C$_x$H$_y^+$ or (C$_x$H$_y$)$_n^+$ is used as a co-implant in the light doped drain/source, a PLDD can be formed using, for example, B, BF$_2$, B$_w$H$_z^+$, or (B$_w$H$_z$)$_m^+$ as a light dopant in the source region and the drain region.

According to still another embodiment according to the present invention, using hydrocarbon or a derivative thereof (such as C$_x$H$_y^+$ or (C$_x$H$_y$)$_n^+$) as a co-implant, and in such situation, the process flow is the same as that shown in FIG. 2 or 7, except that the pre-amorphization 301 and the co-implantation 302 are performed by one step. That is, C$_x$H$_y^+$ or (C$_x$H$_y$)$_n^+$ is used as the implant for the pre-amorphization instead of Si, Ge, etc. and as a co-implant in the implanted regions subsequently formed, to simultaneously achieve the amorphization of the source/drain region in the substrate and the control for the diffusion of the dopants implanted in the subsequent processes, to obtain a good junction profile. The equal energy for such co-implant is preferably less than the implant energy for the source/drain, and for example less than 40 KeV. The dose may be $1 \times 10^{15}$ atoms/cm$^3$ to $3 \times 10^{15}$ atoms/cm$^3$. The dopant for the light doped drain/source region may be boron hydride or a derivative thereof, such as B$_w$H$_z^+$ or (B$_w$H$_z$)$_m^+$ to obtain a more preferred shallow junction profile.

Figure 9:
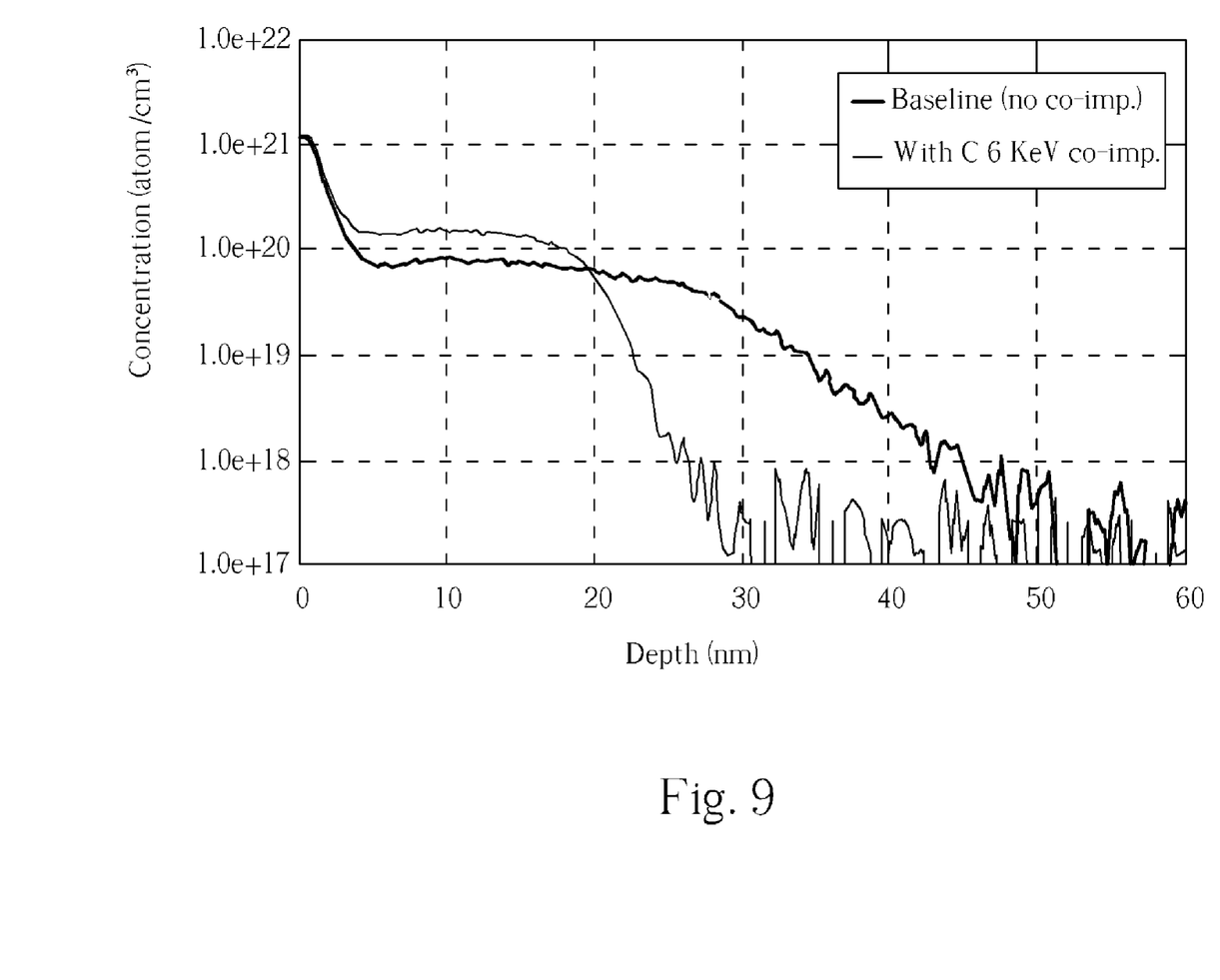
FIG. 9 shows the B profile comparison by a secondary ion mass spectroscopy of PLDD made using the method according to the present invention and PLDD made by a conventional method.

FIG. 9 shows the B profile comparison by a secondary ion mass spectroscopy (SIMS) of PLDD made in one embodiment of the method of forming a MOS transistor according to the present invention, with a co-implantation using a C implant, and PLDD made by a conventional method, without a co-implantation. Both used BF$_2$ of 3 KeV as a dopant for the PLDD implantation, but in the embodiment according to the present invention, a co-implantation was further performed using a C implant of 6 KeV. As shown in FIG. 9, C was used as a co-implant with B to reduce the diffusion of B for forming a shallower and a sharper junction. In comparison with the conventional co-implantation using fluorine, the method of the present invention is more effective on the reduction of B diffusion.

Figure 10:
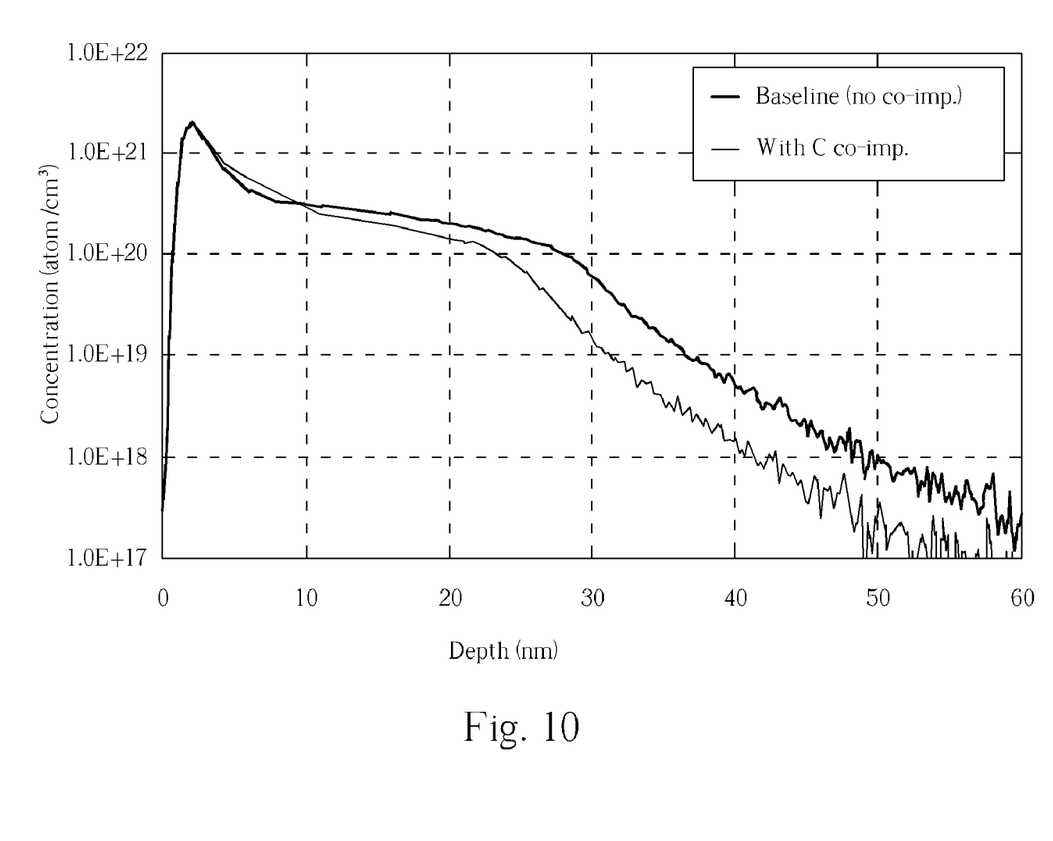
FIG. 10 shows the As profile comparison by a secondary ion mass spectroscopy of NLDD made using the method according to the present invention and NLDD made by a conventional method.

FIG. 10 shows the As profile comparison by a secondary ion mass spectroscopy (SIMS) of NLDD made in one embodiment of the method of forming a MOS transistor according to the present invention, with a co-implantation using a C implant, and PLDD made by a conventional method, without a co-implantation. Both used As of 4 KeV as a dopant in a dose of $1.5 \times 10^{15}$ atoms/cm$^3$ for the NLDD implantation, but in the embodiment according to the present invention, a co-implantation was further performed using a C implant Of 3 KeV. As shown in FIG. 10, C was used as a co-implant with As to reduce the diffusion of As for forming a shallower and a sharper junction.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a MOS transistor, comprising:
   providing a substrate having a gate thereon, a source region and a drain region therein with a channel region under the gate therebetween;
   thereafter pre-amorphizing the source region and the drain region to form amorphized regions;
   thereafter performing a first ion implantation to implant a first dopant in the source region and the drain region to form a first doped region;
   thereafter forming at least a spacer on the sidewalls of the gate;
   thereafter performing a second ion implantation to implant a second dopant in the source region and the drain region to form a second doped region;
   thereafter annealing the source region and the drain region to activate the first dopant, regrow the amorphized regions to a substantially crystalline form, and form a junction profile; and
   performing a co-implantation process, after pre-amorphizing the source region and the drain region and before annealing the source region and the drain region, to implant an co-implant in the source region and the drain region, wherein the co-implant comprises $C_xH_y^+$ or $(C_xH_y)_n^+$, wherein x is a number of 1 to 10, y is a number of 4 to 20, and n is a number of 1 to 1000, and the first dopant comprises B, $BF_2$, $B_wH_z^+$, or $(B_wH_z)_m^+$, wherein w is a number of 2 to 30, z is a number of 2 to 40, and m is a number of 10 to 1000.

2. The method claimed as in claim 1, wherein the co-implant is implanted in the substrate at a place substantially the same as that of the first dopant or the second dopant.

3. The method as claimed in claim 1, further, after pre-amorphizing the source region and the drain region and before performing the first ion implantation, comprising:
   performing a halo implantation to implant a third dopant between the channel region and the source region and between the channel region and the drain region.

4. The method as claimed in claim 3, wherein the co-implant is implanted in the substrate at a place substantially the same as that of the first dopant, the second dopant, or the third dopant.

5. The method as claimed in claim 3, wherein the co-implantation process is performed after pre-amorphizing the source region and the drain region and before performing the halo implantation.

6. The method as claimed in claim 3, wherein the co-implantation process is performed after performing the halo implantation and before performing the first ion implantation.

7. The method as claimed in claim 1, wherein the co-implantation process is performed after pre-amorphizing the source region and the drain region and before performing the first ion implantation.

8. The method as claimed in claim 1, wherein the co-implantation process is performed after performing the first implantation and before performing the second ion implantation.

9. The method as claimed in claim 1, wherein the co-implantation process is performed after performing the second implantation and before annealing the source region and the drain region.

10. A method of forming a MOS transistor, comprising:
    providing a substrate having a gate thereon, a source region and a drain region therein with a channel region under the gate therebetween;
    pre-amorphizing the source region and the drain region to form amorphized regions;
    performing a first ion implantation to implant a first dopant in the source region and the drain region to form a first doped region;
    forming at least a spacer on the sidewalls of the gate;
    performing a second ion implantation to implant a second dopant in the source region and the drain region to form a second doped region;
    annealing the source region and the drain region to activate the first dopant, regrow the amorphized regions to a substantially crystalline form, and form a junction profile; and
    performing a co-implantation process, after pre-amorphizing the source region and the drain region and before annealing the source region and the drain region, to implant a co-implant in the source region and the drain region, wherein the co-implant comprises $C_xH_y^+$ or $(C_xH_y)_n^+$, wherein x is a number of 1 to 10, y is a number of 4 to 20, and n is a number of 1 to 1000, and the first dopant comprises B, $BF_2$, $B_wH_z^+$, or $(B_wH_z)_m^+$, wherein w is a number of 2 to 30, z is a number of 2 to 40, and m is a number of 10 to 1000.

11. The method as claimed in claim 10, wherein the co-implant is implanted in the substrate at a place substantially the same as that of the first dopant or the second dopant.

12. The method as claimed in claim 10, further, after pre-amorphizing the source region and the drain region and before performing the first ion implantation, comprising:
    performing a halo implantation to implant a third dopant between the channel region and the source region and between the channel region and the drain region.

13. The method as claimed in claim 12, wherein the co-implant is implanted in the substrate at a place substantially the same as that of the first dopant, the second dopant, or the third dopant.

14. The method as claimed in claim 12, wherein the co-implantation process is performed after pre-amorphizing the source region and the drain region and before performing the halo implantation.

15. The method as claimed in claim 12, wherein the co-implantation process is performed after performing the halo implantation and before performing the first ion implantation.

16. The method as claimed in claim 10, wherein the co-implantation process is performed after pre-amorphizing the source region and the drain region and before performing the first ion implantation.

17. The method as claimed in claim 10, wherein the co-implantation process is performed after performing the first implantation and before performing the second ion implantation.

18. The method as claimed in claim 10, wherein the co-implantation process is performed after performing the second implantation and before annealing the source region and the drain region.

* * * * *